US006369604B1

(12) United States Patent
Schreyer et al.

(10) Patent No.: US 6,369,604 B1
(45) Date of Patent: Apr. 9, 2002

(54) SELF-COMPENSATING OUTPUT BUFFER (75) Inventors: Tim A. Schreyer, Hillsboro; Raymond S. Martin, Portland, both of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/299,254

(22) Filed: Apr. 26, 1999

(51) Int. Cl.$^7$ .................... H03K 17/16; H03K 19/0175
(52) U.S. Cl. ............... 326/30; 326/86; 326/27
(58) Field of Search .............. 326/86, 27, 83, 326/30, 26

(56) References Cited

U.S. PATENT DOCUMENTS

| | | | | |
|---|---|---|---|---|
| 5,107,230 A | * | 4/1992 | King ........................ | 333/32 |
| 5,111,075 A | * | 5/1992 | Ferry et al. ............... | 326/27 |
| 5,231,311 A | * | 7/1993 | Ferry et al. ............... | 326/27 |
| 5,414,583 A | | 5/1995 | Jordan ...................... | 361/91 |
| 5,602,494 A | * | 2/1997 | Sundstrom ................ | 326/39 |
| 5,729,152 A | | 3/1998 | Leung et al. .............. | 326/21 |
| 5,760,601 A | | 6/1998 | Frankeny .................. | 326/30 |
| 5,959,473 A | * | 9/1999 | Sakuragi ................... | 327/111 |
| 6,097,223 A | * | 8/2000 | Loughmiller ............. | 327/112 |
| 6,097,237 A | * | 8/2000 | Singh ........................ | 327/389 |

FOREIGN PATENT DOCUMENTS

EP 0785628 7/1997 ......... H03K/19/003

OTHER PUBLICATIONS

Volgers, R., "Using 74HCT HCMOS to replace LSTTL and drive transmission lines", *Electronic Components and Applications*, 7 (3), pp. 151–162, (1985).

* cited by examiner

*Primary Examiner*—Michael Tokar
*Assistant Examiner*—Daniel D. Chang
(74) *Attorney, Agent, or Firm*—Schwegman, Lundberg, Woessner & Kluth, P.A.

(57) ABSTRACT

An integrated circuit is described comprising a signal source. Additionally, the integrated circuit includes an output buffer operatively coupled to the signal source. The output buffer generates an output signal in response to a voltage transition at the signal source. Moreover, the output buffer can be coupled to a transmission line terminated with a circuit, wherein the transmission line has a characteristic impedance which can vary over a range of A to B. The output buffer has a voltage-current (V-I) curve having a voltage that is approximately constant over the range of A to B, wherein the output signal can be transmitted to the circuit such that the output signal reaches a stable voltage after one round trip.

15 Claims, 11 Drawing Sheets

SELF-COMPENSATING OUTPUT BUFFER

FIELD

The present invention relates to printed circuit board interconnects and in particular the present invention relates to printed circuit board interconnects with limited overshoot variations and reflections.

BACKGROUND

Figure 1:
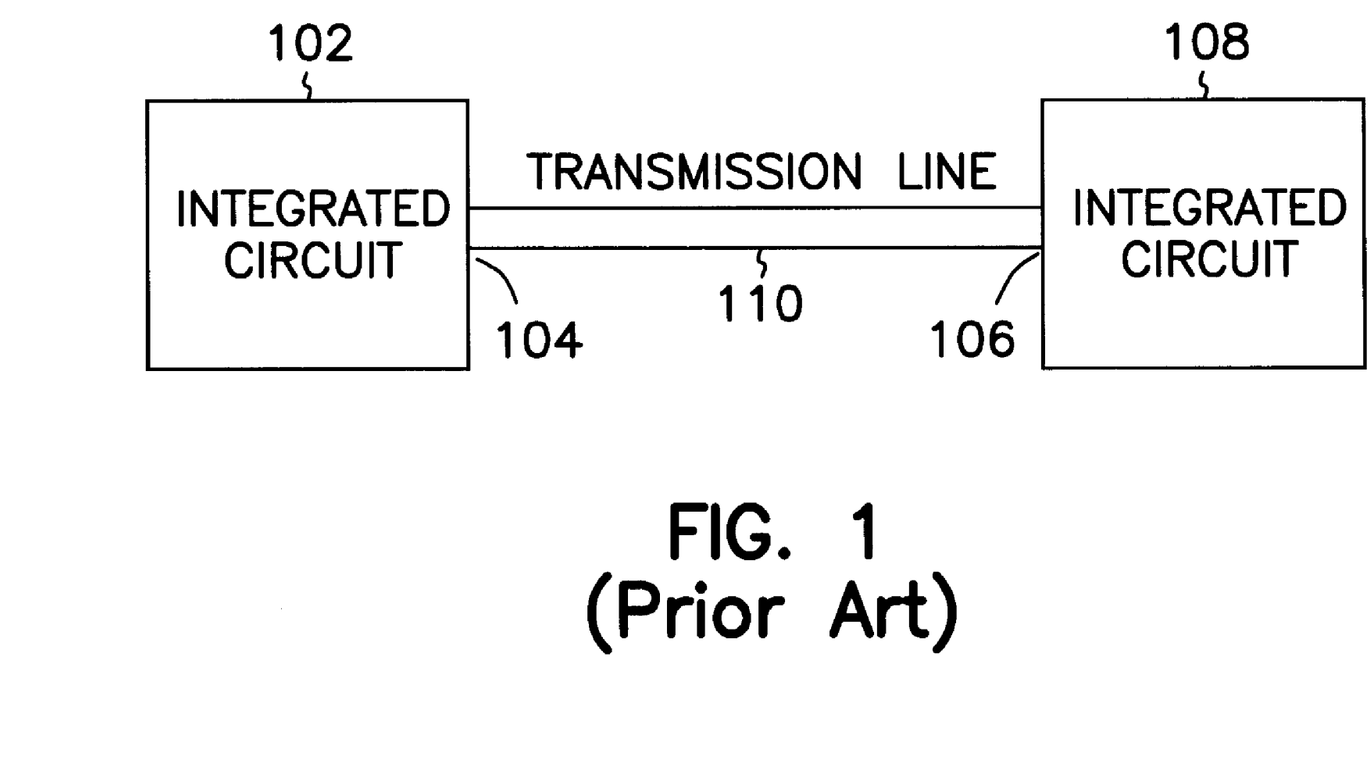
FIG. 1 is a block diagram of a system of integrated circuits.

One of the design challenges facing the electronics industry is the reflection on transmission lines (e.g., traces on a PCB (printed circuit board)). Not limiting these reflections can cause problems that can have an impact at the digital level, including increased delays, increased overshoot and increased ringing (i.e., oscillations) in the signal response. FIG. 1 illustrates a typical system involving these reflection issues, wherein two integrated circuits are operatively coupled by a transmission line. FIG. 1 includes integrated circuit 102, integrated circuit 108, transmission line 110, output node 104 and input node 106. In general, a signal travels from output node 104 to input node 106, and each time there is a reflection from input node 106 back to output node 104 or vice versa, causing a doubling of the total voltage. Integrated circuit 102 has an impedance of $Z_{buf}$ at output node 104. Integrated circuit 108 is operatively coupled to integrated circuit 102 through transmission line 110 having a characteristic impedance, $Z_o$.

Figure 2:
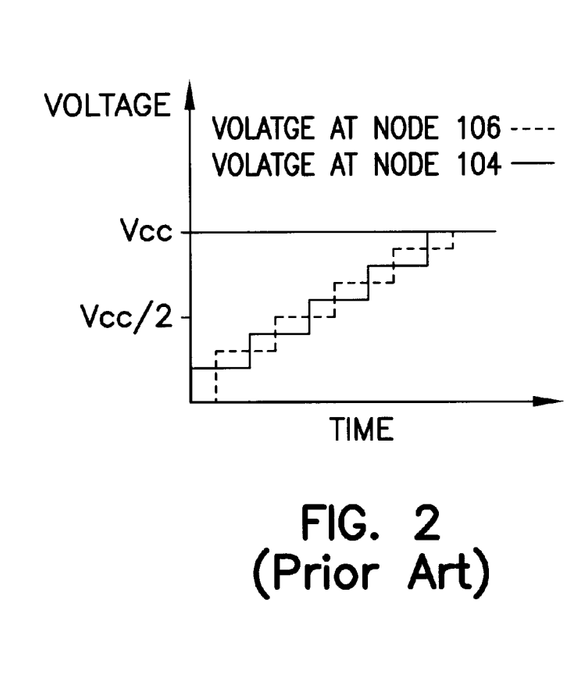
FIG. 2 is a graph of voltage v. time for a system having stair-stepping behavior.

FIG. 2 is a graph of the voltage over time of the voltages at output node 104 and input node 106 with $Z_{buf}$ greater than $Z_o$ causing the initial step voltage at output node 104 to be less than $V_{cc}/2$. This in effect causes a sequence of stair steps between the voltage at output node 104 and the voltage at input node 106 wherein the voltage at output node 104 has an initial step and the voltage at input node 106 jumps to twice that voltage with the refections between output node 104 and 106 building up until voltages reach $V_{cc}$ (i.e., stair-stepping behavior). Once $V_{cc}$ is reached, the system stabilizes. The problem with this system is the very long delay between the initial step and the stabilizing point at $V_{cc}$.

Figure 3:
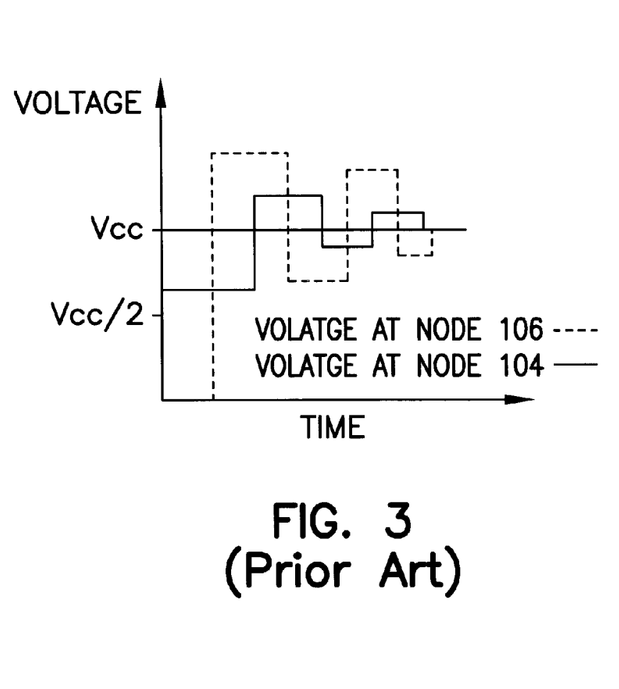
FIG. 3 is a graph of voltage v. time for a system having overshoot behavior.

FIG. 3 is a graph of the voltage over time of the voltages at output node 104 and input node 106 with $Z_{buf}$ less than $Z_o$ causing the initial step voltage at output ode 104 to be greater than $V_{cc}/2$. This forces the voltage at input node 106 to overshoot the desired voltage, $V_{cc}$ (i.e., overshoot behavior). As shown, the voltages at output node 104 and input node 106 continue to bounce above and below $V_{cc}$ until reaching $V_{cc}$ and thus stabilizing at some later point in time.

These reflection problems have been addressed by controlling impedance, $Z_{buf}$, at output buffer 104 using driver impedance matching wherein the output impedance, $Z_{buf}$, matches the characteristic impedance, $Z_o$. This impedance matching forces the initial voltage at node 114 to be $V_{cc}2$. With this voltage, $V_{cc}/2$, being transmitted down transmission line 110, this voltage arrives at input node 106, where a reflection is produced. Adding this reflected voltage to the initial voltage at input node 106, both of which are also approximately ½ of $V_{cc}$, the total voltage at input node 106 is approximately equal to $V_{cc}$. Moreover, the reflected voltage at input node 106 ($V_{cc}/2$) is transmitted back toward output node 104 causing the voltage at output node 104 to add this voltage to the voltage already residing at output node 104 ($V_{cc}/2$) to provide a total voltage of $V_{cc}$ at output node 104. Thus the voltage at input node 106 is twice the initial step voltage at output node 104. In summary, making the voltage at output node 104 $V_{cc}/2$ causes the voltage at input node 106 to be $V_{cc}$. Once $V_{cc}$ is reached the system is stabilized. Therefore, at input node 106, no further reflections are produced.

Figure 4:
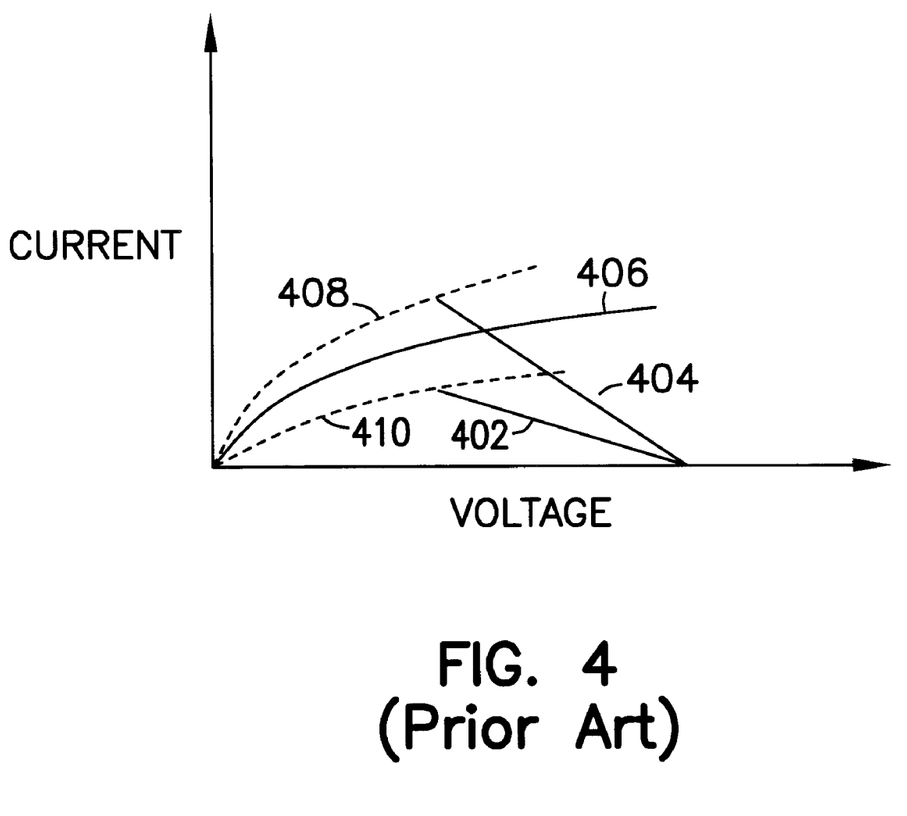
FIG. 4 is a voltage-current (V-I) curve having impedance matching through the use of digital logic compensation circuitry to compensate based on output impedance.

FIG. 4 is a voltage-current (V-I) curve wherein the output impedance, $Z_{buf}$ and the characteristic impedance, $Z_o$, match through the use of digital logic compensation circuitry to compensate based on $Z_o$. This circuitry senses the level of the characteristic impedance and changes the V-I curve by controlling how much current comes out of the buffer to maintain the voltage at $V_{cc}/2$. In particular, FIG. 4 illustrates three different V-I curves (curves 406, 408 and 410) which are varied by the digital control circuitry in the range between load lines 402 and 404 to match the output impedance to the characteristic impedance. In addition to the costs involved with this compensation circuity, this solution also requires several clock cycles to program the buffer to the correct configuration to match the impedances between the buffer and the transmission line.

Elimination of reflections also addresses another design challenge facing the electronics industry: an interconnect-related effect called Inter-Symbol Interference (ISI). ISI occurs at times when there is ringing (oscillation) on one data cycle (bit) which causes a change in the timing of any subsequent bits. ISI affects signals when the driver does not reach steady state prior to the next switching cycle. Additionally, ISI introduces greater skew into the timing of a system. Skew is a difference in arrival times (i.e., the difference in flight times) between two signals in a system when the two signals are employed to remain synchronized within close tolerances.

Even though using current compensated buffers has been shown to be effective in impedance matching, this approach is expensive and limited in its performance in that it typically can only achieve interconnect skews of 500 picoseconds (psec). For the reasons stated above, and for other reasons stated below which will become apparent to those skilled in the art upon reading and understanding the present specification, there is a need in the art for a low-cost circuit which better controls the above-described overshoot and ringing, while also providing a reduction of the interconnect skews.

SUMMARY

In one embodiment, an integrated circuit includes a signal source. Additionally, the integrated circuit includes an output buffer operatively coupled to the signal source. The output buffer generates an output signal in response to a voltage transition at the signal source. Moreover, the output buffer can be coupled to a transmission line terminated with a circuit, wherein the transmission line has a characteristic impedance which can vary over a range of A to B. The output buffer has a voltage-current (V-I) curve having a voltage that is approximately constant over the range of A to B, wherein the output signal can be transmitted to the circuit such that the output signal reaches a stable voltage after one round trip.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

Figure 5:
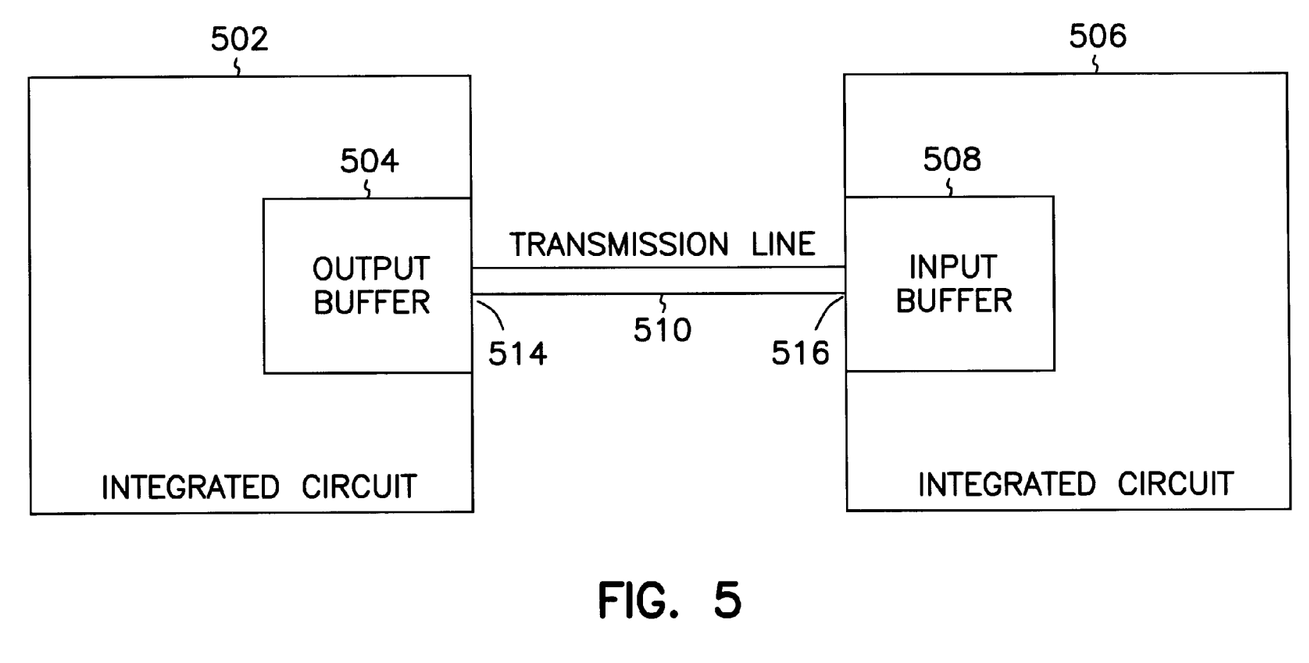
FIG. 5 is a block diagram of a system of integrated circuits of the present invention.

Referring to FIG. 5, the system includes integrated circuit 502, output buffer 504, integrated circuit 506, input buffer 508, transmission line 510, output node 514 and input node 516. Integrated circuits 502 and 506 can be any type of integrated circuit, including, but not limited to, processors, controllers, memory devices, and application specific integrated circuits (ASIC). In one embodiment, integrated circuit 502 includes a signal source that generates a signal that is transmitted through transmission line 510 to integrated circuit 506. In one embodiment, output buffer 504 is incorporated into distribution of a system clock on a motherboard of a computer, with output buffer 504 used in buffering the clock signal prior to its distribution to several different input buffers. In a further embodiment, output buffer 504 is incorporated into a system using a high-speed graphics bus (e.g., AGP (Accelerated Graphics Port)).

Figure 6:
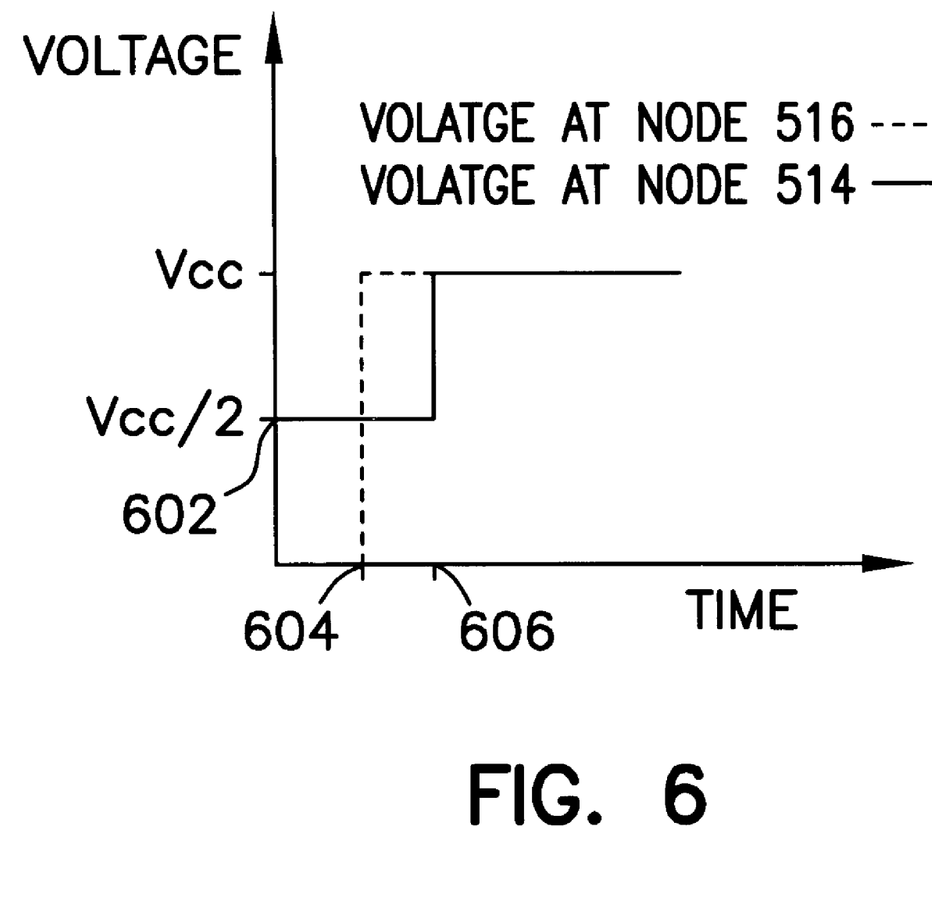
FIG. 6 is a graph of voltage v. time for a system which reaches a stable condition in one round trip delay of the transmission line.

FIG. 6 is a graph of the voltage over time of the voltages of an output signal being transmitted between output node 514 and input node 516, such that the output signal reaches a stable voltage after one round trip. In other words, the voltage of the output signal has optimal reflective behavior (i.e., no overshoot or stair-stepping). Initially, at voltage point 602 of FIG. 6, the voltage of the output signal at output node 514 equals approximately ½ of the source voltage. With this signal having a voltage of $V_{cc}/2$ being transmitted down transmission line 510, a finite time later at time point 604 this signal arrives at input node 516, where a reflection is produced. Adding this reflected voltage to the initial voltage at input node 516, both of which are also approximately ½ of $V_{cc}$, the total voltage at input node 516 at time point 604 is approximately equal to $V_{cc}$. Moreover, the reflected voltage at input node 516 ($V_{cc}/2$) is transmitted back toward output node 514 causing the voltage at output node 514 to add this voltage to the voltage already residing at output node 514 ($V_{cc}/2$) to provide a total voltage of $V_{cc}$ at output node 514 at time point 606. Thus the voltage at input node 516 is twice the initial step voltage at output node 514. In summary, making the voltage of the output signal at output node 514 $V_{cc}/2$ causes the voltage at input node 516 to be $V_{cc}$. Once $V_{cc}$ is reached the system is stabilized. Therefore, at output node 506, no further reflections are produced (i.e., a single reflection is returned to output node 506).

In one embodiment, transmission line 510 comprises traces on a PCB (printed circuit board). Transmission line 510 has a characteristic impedance which can vary within a certain range of values, A and B. In one embodiment wherein output buffer is placed in a computer using a high-speed graphics bus (e.g., AGP (Accelerated Graphics Port)) or in a clock distribution network, this range of values is between approximately 40 and 80 ohms. In another embodiment, this range of values is between approximately 10 and 40 ohms.

Output buffer 504 through its output node is insensitive to interconnect characteristic impedance with transmission line 510 within a certain region of interest. The region of interest is the range between A and B. Therefore, the voltage of the signal being generated by integrated circuit 502 at output node 514 remains approximately constant over this range of impedances. In one embodiment, this voltage is one-half of a source voltage. This source voltage can vary, but in one embodiment, this voltage is in a range of 1.5 to 1.8 volts (v).

Figure 7:
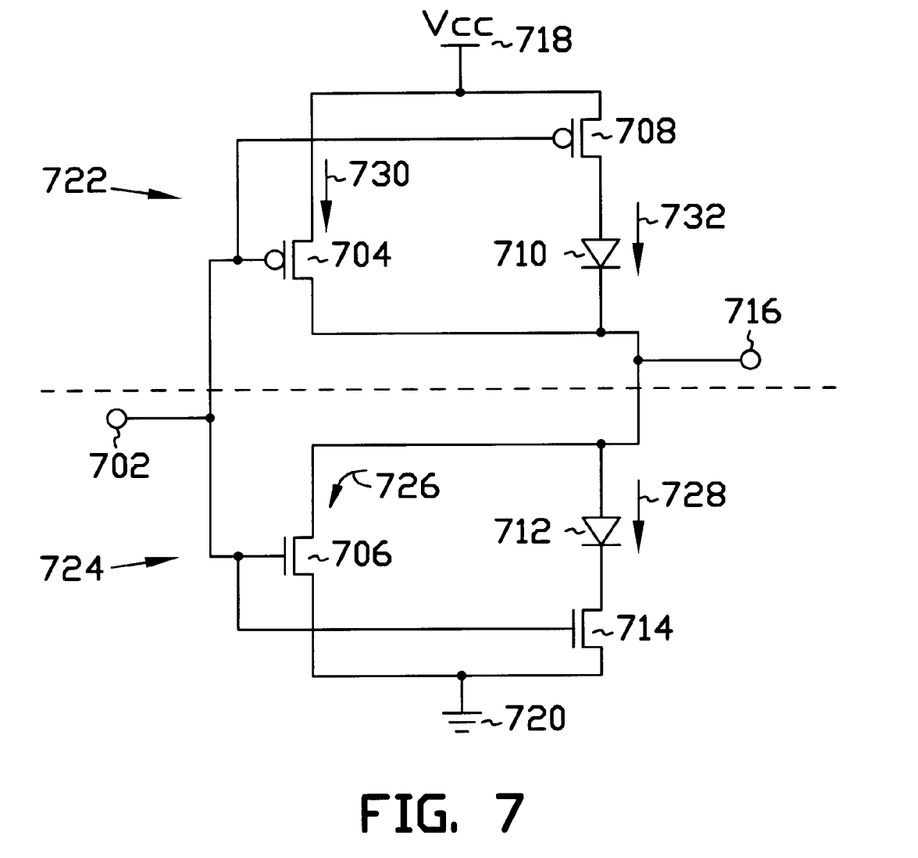
FIG. 7 is a schematic diagram of one embodiment of the self-compensating output buffer of the present invention.

FIG. 7 is a schematic diagram of one embodiment of the self-compensating output buffer of the present invention. In particular, FIG. 7 provides one embodiment for output buffer 504 of FIG. 5. Output buffer 504 includes pullup circuitry 722 and pulldown circuitry 724. Pullup circuitry 722 and pulldown circuitry 724 include transistors 704, 706, 708 and 714. In one embodiment, transistors 704, 706, 708 and 714 are integrated circuit transistors produced using a standard complementary metal-oxide-semiconductor (CMOS) integrated circuit fabrication process, such as MOS field-effect transistors (MOSFET), having source and drain regions, and a gate electrode.

In pullup circuitry 722, the gate of transistor 704 within current path 730 is coupled to input node 702. The source of transistor 704 is coupled to upper source voltage 718, and its drain is coupled to output node 716. The gate of transistor 708 within current path 732 is coupled to input node 702. The source of transistor 708 is coupled to upper source voltage 718, and its drain is coupled to the anode of diode 710. The anode of diode 710 within current path 732 is coupled to the drain of transistor 708, and its cathode is coupled to output node 716.

In pulldown circuitry 724, the gate of transistor 706 within current path 726 is coupled to input node 702. The source of transistor 706 is coupled to lower source voltage 720, and its drain is coupled to output node 716. The gate of transistor 714 within current path 628 is coupled to input node 702. The source of transistor 714 is coupled to lower source voltage 720, and its drain is coupled to the cathode of diode 712. The cathode of diode 712 within current path 728 is coupled to the drain of transistor 714, and its anode is coupled to output node 716.

FIGS. 8 through 11 are graphs of the voltage-current (V-I) curves of one embodiment of the pulldown and pullup transitions of the self-compensating output buffer of the present invention, wherein the voltage is the source voltage and the current is the output current for the output buffer. For purposes of clarity, the V-I curves and the corresponding descriptions for the self-compensating output buffer were divided into pullup and pulldown transitions.

Pulldown Transition

Figure 8:
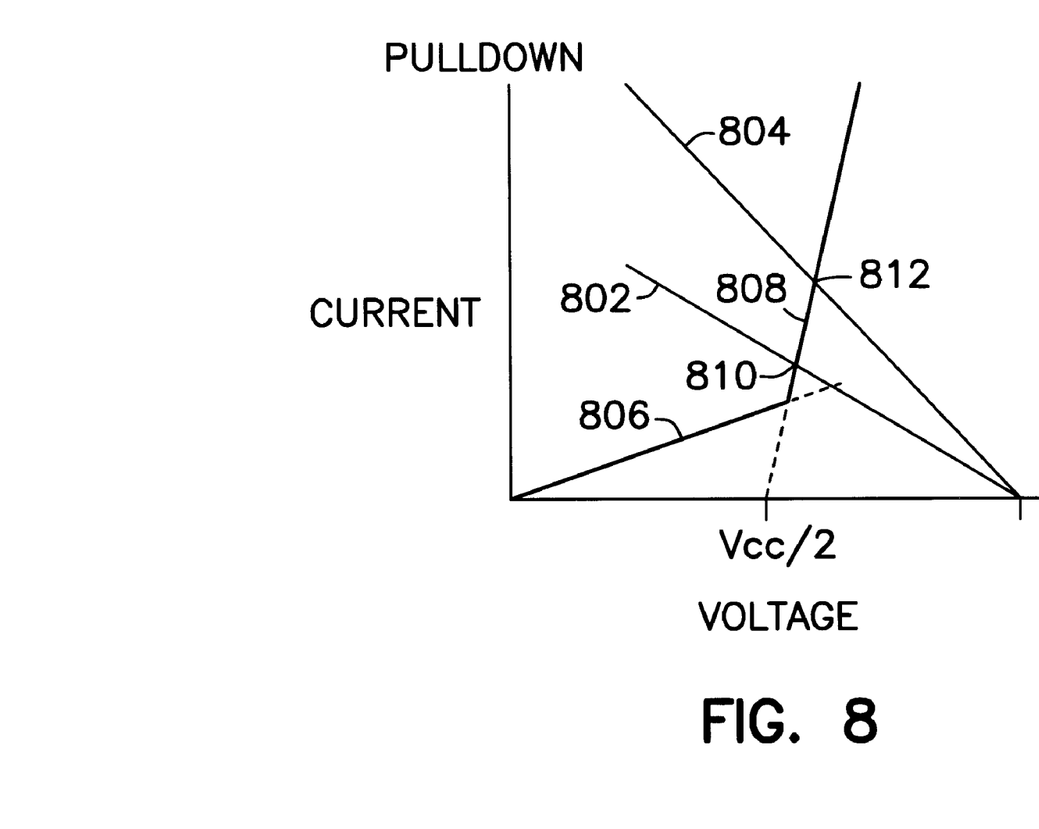
FIG. 8 is one embodiment of a graph of a voltage-current (V-I) curve of one embodiment of the pulldown circuitry of the self-compensating output buffer of the present invention.
Figure 9:
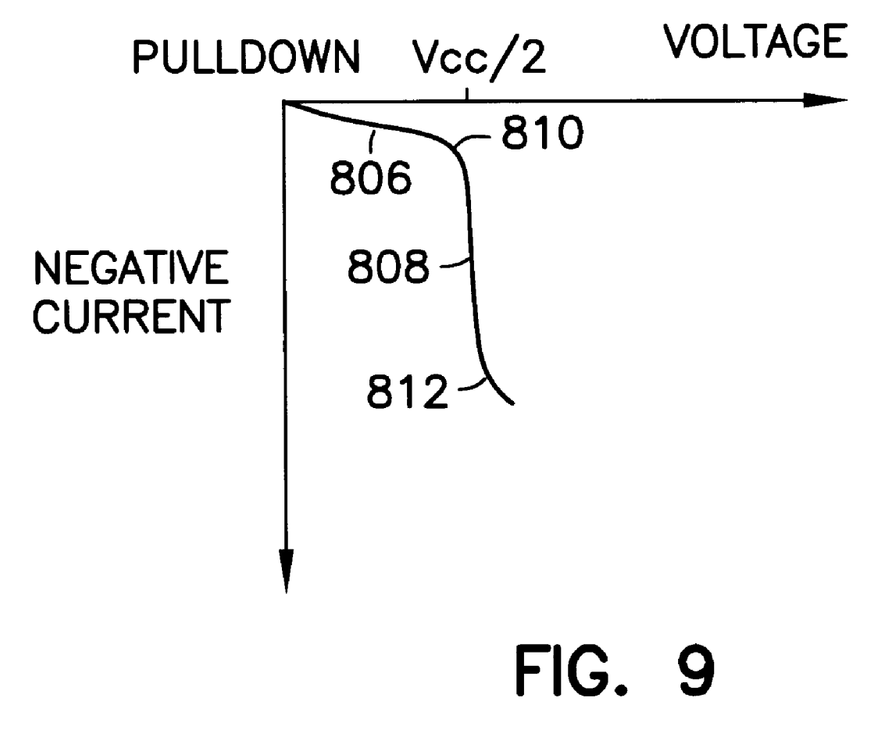
FIG. 9 is another embodiment of a graph of a voltage-current (V-I) curve of one embodiment of the pulldown circuitry of the self-compensating output buffer of the present invention.

FIGS. 8 and 9 are different embodiments of the graphs of the V-I curve during a pulldown transition of the embodiment of output buffer 504 shown in FIG. 5. FIG. 8 shows the V-I curve, in terms of a positive current flowing into output buffer 504, which is comprised of curve portion 806 in conjunction with curve portion 808 (i.e., the "constant voltage" portion), of output buffer 504 during a pulldown transition. Load lines 802 and 804 are the respective maximum and minimum characteristic load line impedances of transmission line 510 between which an approximately constant voltage is maintained. In particular, the reciprocal of the slopes of lines 802 and 804 represent the characteristic impedance range, A to B, of transmission line 510. Curve point 810 and curve point 812 are the respective points on the V-I curve where load line 802 and load line 804 intersect the V-I curve (i.e., the range of the maximum and minimum characteristic impedance) and between which a constant voltage ($V_{cc}/2$) is maintained.

Correspondingly, FIG. 9 shows the V-I curve in terms of a positive current flowing out of output buffer 504 during the same pulldown transition, absent the load lines. Numbering of the elements between FIG. 8 and FIG. 9 are consistent for those elements which correspond. Therefore, curve portion 806 and curve portion 808 (i.e., the "constant voltage" portion) represent the V-I curve. Additionally, curve point 810 and curve point 812 represent the knees of the V-I curve representing the range of the maximum and minimum characteristic impedance and between which an approximately constant voltage ($V_{cc}/2$) is maintained.

Describing the operation of output buffer 504 of FIG. 5 in conjunction with the graphs of the pulldown transition shown in FIGS. 8 and 9, input node 702 begins at the lower source voltage. Input node 702 begins receiving an input signal having a voltage which causes pulldown circuitry 724 of output buffer 504 to move toward an active state while moving pullup circuitry 722 to an inactive state. In particular for pulldown circuitry 724, transistors 706 and 714 begin conducting, even though not fully turned on. Diode 712, however, acts essentially as an open circuit until there is a sufficient voltage drop, $V_f$, (about 0.7 volts (v)) across the diode. Until this voltage drop point is reached, therefore, the impedance seen by output node 716 is the impedance of transistor 706 through current path 726, as seen as curve portion 806 in FIGS. 8 and 9.

As the voltage of the input signal at input node 702 continues to increase, transistor 706 and transistor 714 turn on. This allows lower source voltage 720 to provide a voltage drop of 0.7 v across diode 712 thereby causing diode 712 to be forward-biased. The impedance through current path 726 which includes transistor 706 is greater than the impedance through current path 728 which includes transistor 714 and diode 712, as seen in curve portion 808. In one embodiment, the maximum value of the impedance of transistor 706 is within a range of 200–500 ohms. In another embodiment, the impedance of transistor 706 is greater than 75 ohms. In comparison, ideally the impedance of transistor 714 in series with diode 712 is zero. In one embodiment, this impedance is less than the impedance of transmission line 510 divided by 10. In another embodiment, this impedance is less than 10 ohms. The impedance of transistor 714 and diode 712, therefore, is less than the impedance of transistor 706 to provide a step-in current.

Because of this impedance differential between current path 726 and current path 728, once diode 712 is forward-biased to provide an increased current flow through current path 728, the impedance seen by output node 716 is essentially the impedance of transistor 714 and diode 712, illustrated as curve portion 808 of FIGS. 8 and 9. The increased pulldown current occurs between the range of minimum load impedance line 802 and maximum load impedance line 804. Moreover, because the impedance of current path 728 is much less than the impedance of current path 726, the slope of curve portion 808 is much greater than the slope of curve portion 806 to the point of being essentially vertical at approximately 0.7 v (the point at which diode 712 is forward-biased).

Advantageously, this essentially vertical V-I curve in the range of a minimum and maximum characteristic impedance forces the initial voltage of the output signal at output node 716 to $V_{cc}/2$, rather than attempting to match the buffer impedance to the line impedance. In particular, referring back to FIG. 6, this graph illustrates the voltages over time at the output buffer and the input buffer when the initial voltage is $V_{cc}/2$ and there is no unwanted stair-stepping or overshoot behavior, as illustrated in FIGS. 2 and 3. In other words, the output signal reaches a stable voltage after one round trip.

The effect of combining the output impedance with the characteristic impedance is to create a voltage divider. The ratio of the two impedances defines, thus, the voltage level at the node between the two. Therefore, the goal is to push the initial step voltage of the output signal at the output buffer to $V_{cc}/2$ (voltage point 602 of FIG. 6) to preclude the unwanted stair-stepping or overshoot behavior, as illustrated in FIGS. 2 and 3. Under the prior art, in order to achieve an initial step voltage of the output signal of $V_{cc}/2$ the output impedance would be matched to the characteristic impedance. In contrast, embodiments of the present invention accomplish the initial step voltage of the output signal to $V_{cc}/2$ by maintaining an essentially vertical V-I curve in the range of a minimum and maximum load impedance.

Explained in terms of the V-I curve of FIG. 8, the slope of line 806 represents the impedance of the output buffer, and the slope of line 808 represents the impedance of the transmission line. The point at which these two lines intersect with each other is the voltage of the output signal at the first step at voltage point 602 of FIG. 6. Therefore, in order for the output signal to have a voltage level of $V_{cc}/2$, the intersection of these two lines must occur at approximately $V_{cc}/2$. Because the V-I curve is essentially vertical at $V_{cc}/2$ (at line 808), this logically forces all of the intersections between line 806 and line 808 to be at this voltage. Therefore regardless of the slope of line 806, the intersection of the two lines occurs at $V_{cc}/2$. In turn this provides the required initial voltage step at $V_{cc}/2$, as shown in FIG. 6. Because as explained above for FIG. 6, the voltage of the output signal at input node 516 is twice the initial step voltage at output node 514. Therefore, making the voltage of the output signal at output node 514 $V_{cc}/2$ causes the voltage at input node 516 to be $V_{cc}$. Once $V_{cc}$ is reached the system is stabilized (i.e., no stair-stepping or overshoot behavior).

Using this self-compensating output buffer of FIG. 7, wherein one embodiment it is comprised of two diodes and two transistors, eliminates the need for more costly impedance compensation circuitry. Additionally, this self-compensating output buffer provides the controlling of the voltage at the output node of the output buffer through the use of passive circuit elements (e.g., diodes). Achieving the desired V-I curve by having an approximately constant voltage over a certain range of characteristic impedances has been demonstrated by one embodiment shown in FIG. 7. The invention, however, is not so limited. It should be appreciated by those skilled in the art that this characteristic V-I curve where there is an approximately constant voltage over a certain range of characteristic impedances can be achieved by other embodiments.

Figure 12:
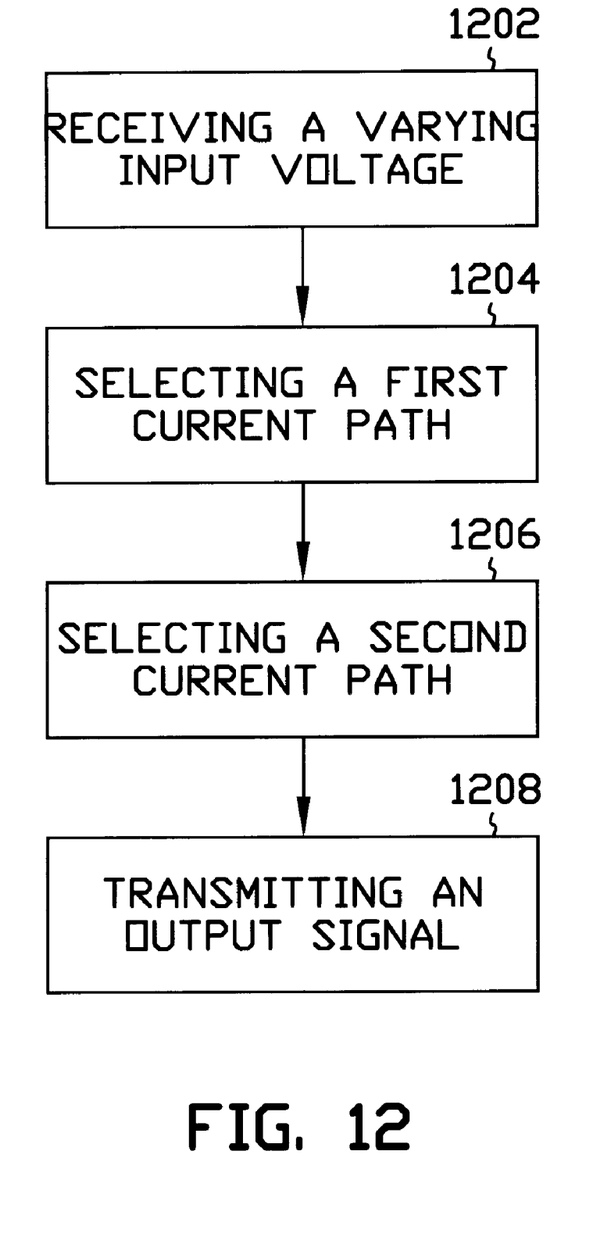
FIG. 12 is a flowchart of a method according to one embodiment of the present invention.

In accordance with the descriptions for FIGS. 8 and 9, FIG. 12 is a flowchart of a method in accordance with an embodiment of the invention. In particular, corresponding to the descriptions of FIGS. 8 and 9 of a pulldown transition, in block 1202, output buffer 504 of FIG. 5 receives an input signal having a varying input voltage. In block 1204, a first current path of output buffer 504 is selected which has first impedance for the current flow between an output node of the self-compensating output buffer and a source voltage based on the varying input voltage of the input signal. During the pulldown transition, this selection of the first current path occurs with the voltage of the input signal at the input node being essentially at ground. The input signal at the input node begins increases its voltage causing pulldown circuitry 724 of output buffer 504 to move toward an active state and pullup circuitry 722 to move toward an inactive state. In particular for pulldown circuitry 724, transistors 706 and 714 begin conducting, even though not fully turned on. Because, as previously described for FIGS. 8 and 9, diode 712 lacks a sufficient voltage drop (about 0.7 v) across itself initially to be forward-biased, current path 728 is essentially an open circuit causing current flow from output node 716 to lower source voltage 720 to be essentially down current path 726 (i.e., the selection of a first current path for current flow between output node 716 and lower source voltage 720).

In block 1206, a second current path of output buffer 504 is selected which has a second different impedance from the first current path to provide current flow between the output node and the source voltage based on the varying input voltage of the input signal. In particular as previously described for FIGS. 8 and 9, once transistor 706 and transistor 714 are turned on due to the increase in the input voltage at input node 702, lower source voltage 720 in conjunction with output node 716 provides the required voltage drop across diode 712 causing diode 712 to be forward-biased. In one embodiment, output buffer 504 is so designed to provide a greater impedance for transistor 706 in comparison with the impedance of both transistor 714 and diode 712. Because of this impedance differential, even though both current paths (current path 726 and current path 728) are conducting, the impedance seen by output node 716 is essentially the impedance down current path 728. The second current path, therefore, is essentially down current path 728 (i.e., the selection of a second current path for current flow between output node 716 and lower source voltage 720).

As previously described, advantageously, the selection of the second current path provides enough current to cause the voltage of the V-I curve of the output buffer 504 to be approximately constant over the range of A to B. This essentially vertical V-I curve in the range of a minimum and maximum characteristic impedance forces the initial voltage of the output signal at output node 716 to $V_{cc}/2$. In block 1208, the output signal is transmitted down the transmission line that is terminated by a circuit, such that the output signal reaches a stable voltage after one round trip, as previously described in reference to FIG. 6.

Pullup Transition

Figure 10:
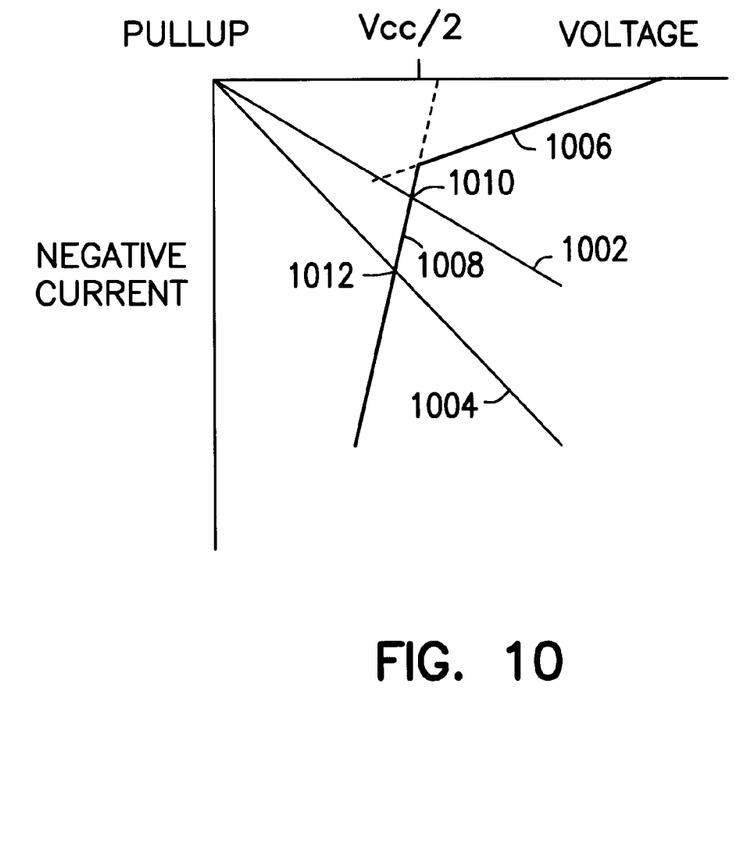
FIG. 10 is one embodiment of a graph of a voltage-current (V-I) curve of one embodiment of the pullup circuitry of the self-compensating output buffer of the present invention.
Figure 11:
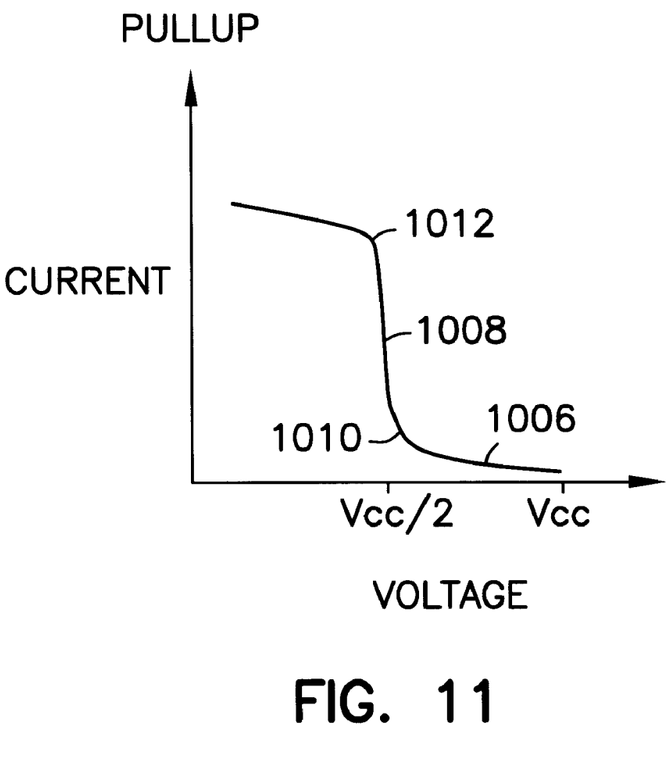
FIG. 11 is another embodiment of a graph of a voltage-current (V-I) curve of one embodiment of the pullup circuitry of the self-compensating output buffer of the present invention.

Similarly, FIGS. 10 and 11 are different embodiments of the graphs of the V-I curve during a pullup transition. FIGS. 10 shows the V-I curve in terms of a positive current flowing into output buffer 504, which is comprised of curve portion 1006 in conjunction with curve portion 1008 (i.e., the "constant voltage" portion), of output buffer 504 during a pullup transition. Load lines 1002 and 1004 are the respective maximum and minimum characteristic impedances of transmission line 510 between which an approximately constant voltage is maintained. In particular, the reciprocal of the slopes of lines 1002 and 1004 represent the characteristic impedance range, A to B, of transmission line 510. Curve point 1010 and curve point 1012 are the respective points on the V-I curve where load line 1002 and load line 1004 intersect the V-I curve (i.e., the range of the maximum and minimum characteristic impedance) and between which a constant voltage ($V_{cc}/2$) is maintained.

Correspondingly, FIG. 11 shows the V-I curve in terms of a positive current flowing out of output buffer 504 during the same pullup transition, absent the load lines. Numbering of the elements between FIG. 10 and FIG. 11 are consistent for those elements which correspond. Therefore, curve portion 1006 and curve portion 1008 (i.e., the "constant voltage" portion) represent the V-I curve. Additionally, curve point 1010 and curve point 1012 represent the knees of the V-I curve representing the range of the maximum and minimum characteristic impedance and between which an approximately constant voltage ($V_{cc}/2$) is maintained.

Describing the operation of output buffer 504 of FIG. 5 in conjunction with the graph of the pulldown transition shown in FIGS. 10 and 11, the voltage of the input signal at input node 702 begins approaching zero, causing pullup circuitry 722 of output buffer 504 moves toward an active state while pulldown circuitry 724 moves to an inactive state. In particular for pullup circuitry 722, transistors 704 and 708 begin conducting, even though not fully turned on. Diode 710, however, acts essentially as an open circuit until there is a sufficient voltage drop, $V_f$, (about 0.7 v) across the diode. Until this voltage drop point is reached, therefore, the impedance seen by output node 716 is the impedance of transistor 704 through current path 730 as seen as curve portion 1006 in FIGS. 10 and 11.

As the voltage of the input signal at input node 702 continues to decrease, transistor 708 and transistor 710 turn on (at about 0.7 volts below $V_{cc}$ (source voltage)). This allows upper source voltage 718 to provide a voltage drop of 0.7 v across diode 710 thereby causing diode 710 to be forward-biased. The impedance through current path 730 which includes transistor 704 is greater than the impedance through current path 732 which includes transistor 708 and diode 710, as seen as curve portion 1008. In one embodiment, the maximum value of the impedance of transistor 704 is within a range of 200–500 ohms. In another embodiment, the impedance of transistor 704 is greater than 75 ohms. In comparison, ideally the impedance of transistor 708 in series with diode 710 is zero. In one embodiment, this impedance is less than the impedance of transmission line 510 divided by 10. In another embodiment, this impedance is less than 10 ohms. The impedance of transistor 708 and diode 710, therefore, is less than the impedance of transistor 704 to provide a step-in current.

Because of this impedance differential between current path 730 and current path 732, once diode 710 is forward-biased to provide an increased current flow through current path 732, the impedance seen by output node 716 is essentially the impedance of transistor 708 and diode 710, illustrated as curve portion 1008 of FIGS. 10 and 11. The increased pulldown current occurs between the range of minimum load impedance line 1002 and maximum load impedance line 1004. Moreover, because the impedance of current path 732 is much less than the impedance of current path 730, the slope of curve portion 1008 is much greater than the slope of curve portion 1006 to the point of being essentially vertical at approximately 0.7 v (the point at which diode 710 is forward-biased).

As previously described advantageously, this essentially vertical V-I curve in the range of a minimum and maximum load impedance forces the initial voltage to $V_{cc}/2$, rather than attempting to match the buffer impedance to the line impedance. In particular, referring back to FIG. 6, this graph illustrates the voltages over time at the output buffer and the input buffer when the initial voltage of the output signal at output node 716 is $V_{cc}/2$ and there is no unwanted stair-stepping or overshoot behavior, as illustrated in FIGS. 2 and 3. In other words, the output signal reaches a stable voltage after one round trip.

The effect of combining the output impedance with the characteristic impedance is to create a voltage divider. The ratio of the two impedances defines, thus, the voltage level at the node between the two. Therefore, the goal is to push the initial step voltage of the output signal at the output buffer to $V_{cc}/2$ (voltage point 602 of FIG. 6) to preclude the unwanted stair-stepping or overshoot behavior, as illustrated in FIGS. 2 and 3. Under the prior art, in order to achieve an initial step voltage of the output signal of $V_{cc}/2$ the output impedance would be matched to the characteristic impedance. In contrast, embodiments of the present invention accomplish the initial step voltage of the output signal to $V_{cc}/2$ by maintaining an essentially vertical V-I curve in the range of a minimum and maximum load impedance.

Explained in terms of the V-I curve of FIG. 10, the slope of line 1006 represents the impedance of the output buffer and the slope of line 1008 represents the impedance of the transmission line. The point at which these two lines intersect with each other is the voltage of the output signal at the first step at voltage point 602 of FIG. 6. Therefore, in order for the output signal to have a voltage level of $V_{cc}/2$, the intersection of these two lines must occur at approximately $V_{cc}/2$. Because the V-I curve is essentially vertical at $V_{cc}/2$ (at line 1008), this logically forces all of the intersections between line 1006 and line 1008 to be at this voltage. Therefore regardless of the slope of line 1006, the intersection of the two lines occurs at $V_{cc}/2$. In turn this provides the required initial voltage step at $V_{cc}/2$, as shown in FIG. 6. Because as explained above for FIG. 6, the voltage at input node 516 is twice the initial step voltage of the output signal at output node 514. Therefore, making the voltage at output node 514 $V_{cc}/2$ causes the voltage of the output signal at input node 516 to be $V_{cc}$. Once $V_{cc}$ is reached the system is stabilized.

Using this self-compensating output buffer of FIG. 6, wherein one embodiment it is comprised of two diodes and two transistors, eliminates the need for more costly impedance compensation circuitry. Additionally, this self-compensating output buffer provides the controlling of the voltage at the output node of the output buffer through the use of passive circuit elements (e.g., diodes). Achieving the desired V-I curve by having an approximately constant voltage over a certain range of characteristic impedances has been demonstrated by one embodiment shown in FIG. 6. The invention, however, is not so limited. It should be appreciated by those skilled in the art that this characteristic V-I curve where there is an approximately constant voltage over a certain range of characteristic impedances can be achieved by other embodiments.

In accordance with the description for FIGS. 10 and 11 of a pullup transition for output buffer 504, FIG. 12 is a flowchart of a method in accordance with an embodiment of the invention. In block 1202, output buffer 504 of FIG. 5 receives an input signal having a varying input voltage. In block 1204, output buffer 504 selects a first current path which has first impedance for the current flow between an output node of the self-compensating output buffer and a source voltage based on the varying input voltage of the input signal. During the pullup transition, this selection of the first current path occurs with the input signal at the input node being at a certain voltage. The voltage of the input signal at the input node begins approaching zero causing pullup circuitry 722 of output buffer 504 to move toward an active state and pulldown circuitry 724 to move toward an inactive state. In particular for pullup circuitry 722, transistors 704 and 708 begin conducting, even though not fully turned on. Because, as previously described for FIGS. 10 and 11, diode 710 lacks a sufficient voltage drop (about 0.7 v) across itself initially to be forward-biased, current path 732 is essentially an open circuit causing current flow from output node 716 to upper source voltage 718 to be essentially down current path 730 (i.e., the selection of a first current path for current flow between output node 716 and upper source voltage 718).

During a pullup transition in block 1206, a second current path is selected which as a second different impedance from the first current path to provide current flow between the output node and the source voltage. In particular as previously described for FIGS. 10 and 11, once transistor 704 and transistor 708 are turned on due to the decrease in the input voltage at input node 702, upper source voltage 718 in conjunction with output node 716 provides the required voltage drop across diode 710 causing diode 710 to be forward-biased. In one embodiment, output buffer 504 is so designed to provide a greater impedance for transistor 704 in comparison with the impedance of both transistor 710 and diode 708. Because of this impedance differential, even though both current paths (current path 730 and current path 732) are conducting, the impedance seen by output node 716 is essentially the impedance down current path 732. The second current path, therefore, is essentially down current path 732 (i.e., the selection of a second current path for current flow between output node 716 and upper source voltage 718).

As previously described, advantageously, the selection of the second current path provides enough current to cause the voltage of the V-I curve of the output buffer 504 to be approximately constant over the range of A to B. This essentially vertical V-I curve in the range of a minimum and maximum characteristic impedance forces the initial voltage of the output signal at output node 716 to $V_{cc}/2$. In block 1208, the output signal is transmitted down the transmission line that is terminated by a circuit, such that the output signal reaches a stable voltage after one round trip, as previously described in reference to FIG. 6.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit comprising:

a signal source; and an output buffer operatively coupled to the signal source to generate an output signal in response to a voltage transition at the signal source, wherein the output buffer can be coupled to a transmission line terminated with a circuit, wherein the transmission line has a characteristic impedance which can vary over a range of A to B, such that the output buffer has a voltage-current (V-I) curve having a voltage that is approximately constant at one-half of a source voltage of the output buffer over the range of A to B, wherein the source voltage is in a range of 1.5 to 1.8 volts, wherein the output signal can be transmitted to the circuit such that the output signal reaches a stable voltage after one round trip.

2. An integrated circuit comprising:

a signal source; and an output buffer coupled to the signal source to generate an output signal in response to a voltage transition at the signal source, the output buffer including a number of passive circuit elements, wherein the output buffer can be coupled to a transmission line terminated with a circuit, wherein the passive elements are capable of holding the output signal constant at one-half of a source voltage of the output buffer over an impedance range of the transmission line, wherein the source voltage is in a range of 1.5 to 1.8 volts, wherein the output signal can be transmitted to the circuit such that the output signal reaches a stable voltage after one round trip, independent of active control circuitry.

3. The integrated circuit of claim 2, wherein the number of passive circuit elements comprise a number of diodes.

4. A system comprising:

a signal source;

an output buffer coupled to the signal source to generate an output signal in response to a voltage transition at the signal source;

a transmission line coupled to the output buffer, wherein the transmission line has a characteristic impedance which can vary over a range of A to B, such that the output buffer has a voltage-current (V-I) curve having a voltage that is approximately constant over the range of A to B; and an input circuit coupled to the transmission line, wherein the output signal is capable of being transmitted to the input circuit with an initial voltage of one-half of a source voltage of the output circuit, wherein the source voltage is in a range of 1.5 to 1.8 volts such that the output signal reaches a stable voltage after one round trip.

5. A system comprising:

a signal source;

an output buffer operatively coupled to the signal source to generate an output signal in response to a voltage transition at the signal source;

a transmission line operatively coupled to the output buffer; and an input circuit operatively coupled to the transmission line such that the output signal reaches a stable voltage after one round trip, independent of active control circuitry, wherein the output buffer includes a number of passive elements to hold the output signal constant at one-half of a source voltage of the output buffer over an impedance range of the transmission line, wherein the source voltage is in a range of 1.5 to 1.8 volts.

6. The system of claim 5, wherein the number of passive circuit elements comprise a number of diodes.

7. A method comprising:

receiving an input signal having a varying input voltage;

selecting a first current path of a circuit having a voltage-current (V-I) curve, the V-I curve having a voltage, the first current path having a first impedance for a current flow between an output node of the circuit and a source voltage based on the varying input voltage of the input signal, such that the output node can be coupled to a transmission line having a characteristic impedance that varies over a range of A to B; and selecting a second current path of the circuit, the second current path having a second impedance for the current flow between the output node and the source voltage based on the varying input voltage of the signal, wherein selecting the first current path and selecting the second current path generates an output signal; and transmitting the output signal such that the output signal reaches a stable voltage after one round trip, wherein the second current path provide enough current to cause the voltage of the (V-I) curve to be approximately constant at one-half of the source voltage over the range of A to B, wherein the source voltage is in a range of 1.5 to 1.8 volts.

8. The method of claim 7, wherein selecting the first current path comprising using a value for the first impedance that is greater than a value for the second impedance.

9. The method of claim 7, wherein selecting the first current path comprises selecting the first current path when the varying input voltage of the input signal is at a first voltage level.

10. The method of claim 9, wherein selecting the second current path comprises selecting the second current path when the varying input voltage of the signal is at a second voltage level which is greater than the first voltage level.

11. A system comprising:

an input node to receive an input voltage;

an output node to provide and output voltage;

a pullup circuit connected between the input and output nodes, the pullup circuit including a passive element;

a pulldown circuit connected between the input and output nodes, the pulldown circuit including a passive element;

a transmission line connected to the output node at one end of the transmission line, the transmission line including an impedance range; and an input circuit connected to the transmission line at another end of the transmission line, wherein the passive elements of the pullup and pulldown circuits are capable of holding an initial voltage value of the output voltage constant at one-half of a source voltage of the pullup and pulldown circuits, wherein the source voltage is in a range of 1.5 to 1.8 volts.

12. The system of claim 11, wherein the pullup circuit further includes: a first transistor connected between the passive element and the source voltage; and a second transistor connected between the output node and the source voltage.

13. The system of claim 11, wherein the pulldown circuit further includes:

a first transistor connected between the passive element and ground; and a second transistor connected between the output node and ground.

14. The system of claim 11, wherein the passive element of the pullup circuit is a diode which has its cathode terminal connected to the output node.

15. The system of claim 11, wherein the passive element of the pulldown circuit is a diode which has its anode terminal connected to the output node.

* * * * *

UNITED STATES PATENT AND TRADEMARK OFFICE
CERTIFICATE OF CORRECTION

PATENT NO. : 6,369,604 B1
DATED : April 9, 2002
INVENTOR(S) : Schreyer et al.

It is certified that error appears in the above-identified patent and that said Letters Patent is hereby corrected as shown below:

Title page,
Item [56], References Cited, OTHER PUBLICATIONS, delete "transmission" and insert -- transmissions --, therefor.

Column 1,
Line 43, delete "ode" and insert -- node --, therefor.
Line 54, delete "$V_{cc}2$" and insert -- $V_{cc}/2$ --, therefor.

Column 3,
Line 25, insert -- DETAILED DESCRIPTION OF THE INVENTION --.

Column 12,
Line 43, delete "and" and insert -- an --, therefor.

Signed and Sealed this

Tenth Day of December, 2002

JAMES E. ROGAN
*Director of the United States Patent and Trademark Office*